United States Patent
Joo (10) Patent No.: US 9,117,538 B2
(45) Date of Patent: Aug. 25, 2015

(54) SEMICONDUCTOR DEVICE, METHOD FOR OPERATING THE SAME, AND SEMICONDUCTOR SYSTEM INCLUDING THE SAME

(71) Applicant: SK HYNIX INC., Icheon (KR)

(72) Inventor: Byoung In Joo, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/177,454

(22) Filed: Feb. 11, 2014

(65) Prior Publication Data

US 2015/0124529 A1    May 7, 2015

(30) Foreign Application Priority Data

Nov. 1, 2013    (KR) ........................ 10-2013-0132473

(51) Int. Cl.
     *G11C 11/34*    (2006.01)
     *G11C 16/30*    (2006.01)
     *G11C 16/10*    (2006.01)
     *G11C 16/26*    (2006.01)

(52) U.S. Cl.
     CPC .............. *G11C 16/30* (2013.01); *G11C 16/107* (2013.01); *G11C 16/26* (2013.01)

(58) Field of Classification Search
     CPC ............................ G11C 16/0483; G11C 16/10
     USPC ..................................................... 365/185.12
     See application file for complete search history.

(56) References Cited

U.S. PATENT DOCUMENTS

| 7,684,260 | B2 | 3/2010 | Ko |
| 7,908,425 | B2 | 3/2011 | Lee et al. |
| 7,995,401 | B2 * | 8/2011 | Kim ......................... 365/185.29 |
| 8,134,873 | B2 * | 3/2012 | Choi et al. .................. 365/185.2 |
| 8,139,416 | B2 * | 3/2012 | Chong et al. ............. 365/185.16 |
| 8,144,513 | B2 | 3/2012 | Hosono et al. |
| 8,195,899 | B2 | 6/2012 | Chen et al. |

* cited by examiner

*Primary Examiner* — Michael Tran (57) ABSTRACT

A semiconductor device includes a page buffer configured to read data out of a memory cell array in response to a bias enable signal, and a control logic configured to generate the bias enable signal and a bias precharge signal that are used to control the memory cell array. The control logic activates the bias enable signal and the precharge signal before a ready/busy signal activating a read operation of the memory cell array is enabled.

19 Claims, 5 Drawing Sheets

SEMICONDUCTOR DEVICE, METHOD FOR OPERATING THE SAME, AND SEMICONDUCTOR SYSTEM INCLUDING THE SAME

CROSS-REFERENCE TO RELATED APPLICATION

This application claims priority based upon Korean patent application No. 10-2013-0132473, filed on Nov. 1, 2013, the disclosure of which is hereby incorporated in its entirety by reference herein.

BACKGROUND

Embodiments of the present invention relate to a semiconductor device, a method for operating the same, and a semiconductor system including the same, and more particularly, to a technology for reducing a data read time of a memory cell of a semiconductor device.

Generally, a memory device receives a write command or a read command from a host. Thereafter, a memory controller in the memory device operates to program data in or read out data from a corresponding cell in a memory cell region.

Memory devices are classified as volatile memory devices or non-volatile memory devices according to whether data is retained or not when a power source is cut off. Recently, electronic appliances have been developed to have lower power consumption and smaller sizes. Thus, non-volatile memory devices such as flash memory devices are widely used in various electronic appliances.

A flash memory device is a type of electrically erasable and programmable read-only memory (EEPROM) in which multiple memory regions can be erased or programmed by a single program action.

A system including a flash memory device can operate more quickly and more effectively than a system which reads data from and writes data in other memory devices. All types of flash memory devices include cells that wear out after a predetermined number of erase operations. This is because an insulation film enclosing a charge storage element of a cell, which is configured to store data, is damaged by the erase operations.

A flash memory device is designed to retain data stored therein even when it is not powered. That is, a flash memory device can retain stored data without power consumption.

In addition, a flash memory device has excellent resistance to physical impact and a very high read access speed. As a result, flash memory devices have been widely used as storage devices in mobile products using battery power.

A flash memory device is classified as a NOR flash memory device or a NAND flash memory device depending on the type of logic gate used in the storage unit of the device.

A flash memory device is configured to store data in an array of transistors called cells. Flash memory devices may include a single-level cell or a multi-level cell. In a single-level cell device, a cell stores 1-bit data. In a multi-level cell device, a cell stores two or more bit data by changing an amount of charges on a floating gate of the cell.

A memory cell region of a flash memory device includes a plurality of strings. Each string includes memory cells coupled in series to each other. Each string further includes selection transistors formed at both ends thereof. Memory cells disposed in different strings may be electrically coupled to each other through a word line.

In addition, individual strings are electrically coupled to a page buffer, which is configured to sense data, through a bit line. In order to record data in a selected memory cell, a program operation and a verification operation are repeatedly performed a predetermined number of times until data temporarily stored in the page buffer is programmed in the selected memory cell.

If a program voltage is applied to a control gate of the selected memory cell, a tunneling phenomenon occurs in a floating gate of the selected memory cell so that the program operation is carried out. In addition, if an erase voltage is applied to a bulk of the selected memory cell, the tunneling phenomenon occurs in the floating gate so that an erase operation is carried out. For reference, the program voltage is applied to the selected memory cell through a word line coupled to the control gate of the selected memory cell.

BRIEF SUMMARY

Various embodiments of the present invention are directed to providing a semiconductor device, a method for operating the same, and a semiconductor system including the same, that substantially obviate one or more problems due to limitations and disadvantages of the related art.

An embodiment of the present invention relates to a technology for improving read performance by reducing a read operation time of a semiconductor device.

In accordance with an embodiment, a semiconductor device includes: a page buffer suitable for reading data of a memory cell array in response to a bias enable signal; and a control logic suitable for generating the bias enable signal and a bias precharge signal that are used to control a read operation of the memory cell array, wherein the control logic activates the bias enable signal and the precharge signal before a ready/busy signal indicating that output data of the memory cell array is applied to the page buffer is activated during the read operation.

In accordance with another embodiment, a method for operating a semiconductor device includes: activating a bias enable signal for performing a read operation; activating a bias precharge signal for precharging a memory cell array; and reading data of the memory cell array through activation of a ready/busy signal, and storing the read data in a page buffer.

It is to be understood that both the foregoing general description and the following detailed description of embodiments of the present invention are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Reference will now be made in detail to various embodiments of the present invention, examples of which are illustrated in the accompanying drawings. Wherever possible, the same reference numbers will be used throughout the drawings to refer to the same or like parts.

Figure 1:
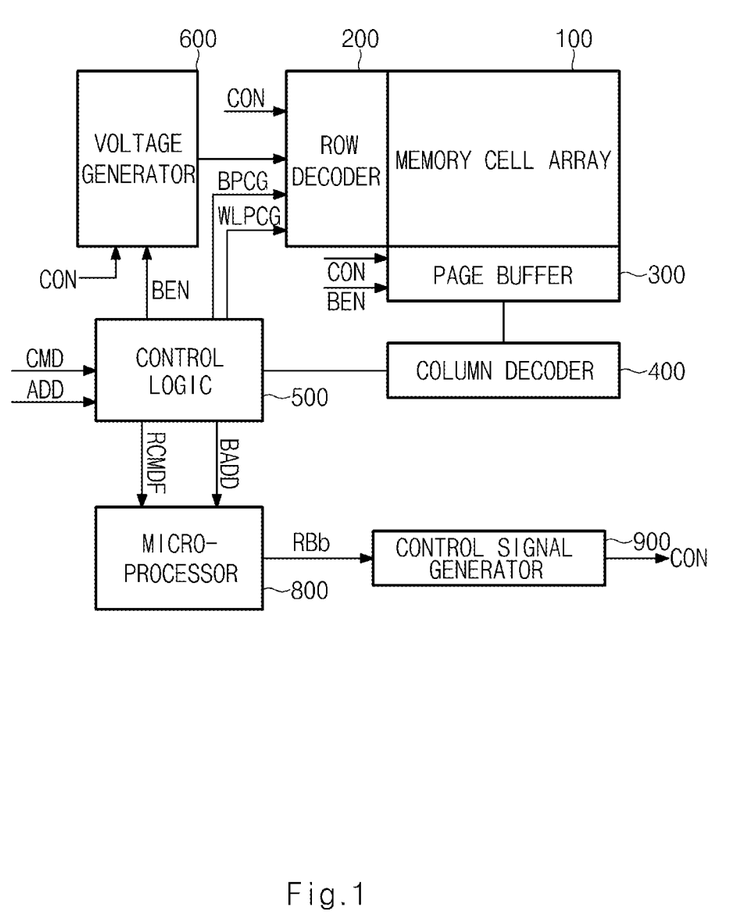
FIG. 1 is a block diagram illustrating a semiconductor device according to an embodiment.

FIG. 1 is a block diagram illustrating a semiconductor device according to an embodiment.

Referring to FIG. 1, the semiconductor device includes a memory cell array 100, a row decoder 200, a page buffer 300, a column decoder 400, a control logic 500, a voltage generator 600, a microprocessor 800, and a control signal generator 900.

The memory cell array 100 includes a plurality of memory cells configured to store program data. The plurality of memory cells is coupled to word lines and bit lines. The memory cell array 100 may have a NAND-type string structure.

The row decoder 200 selects one of a plurality of rows (or pages) of the memory cell array 100 in response to a control signal CON received from the control signal generator 900.

In particular, the row decoder 200 selects a word line of the memory cell array 100 in response to a row address. The selected row (or page) may be driven by the row decoder 200 in response to a drive voltage received from the voltage generator 600.

The row decoder 200 may provide a program, verification, or read voltage to the selected word line according to an operational mode of the semiconductor device. In a program operation, the row decoder 200 may provide a program voltage to the selected word line and a pass voltage to non-selected word lines. In a read operation, the row decoder 200 may provide a read voltage to the selected word line.

The row decoder 200 receives a block bias precharge signal BPCG for accessing a memory block from the control logic 500, and precharges a memory block of the memory cell array 100 with a block bias. The row decoder 200 also receives a wordline bias precharge signal WLPCG for accessing a wordline from the control logic 500, and precharges a wordline of the memory cell array 100 with a wordline bias.

The page buffer 300 is coupled to a plurality of bit lines of the memory cell array 100. In the read operation, the page buffer 300 may sense voltages of the plurality of bit lines, and output read data corresponding to the sensed voltages to the column decoder 400. In the program operation, the page buffer 300 may temporarily store data to be programmed in the memory cell array 100.

The above-mentioned operations of the page buffer 300 may be controlled by the control signal CON received from the control signal generator 900.

The page buffer 300 may operate as a write driver or a sense-amplifier according to the operational mode of the semiconductor device. The page buffer 300 operates as the sense-amplifier in the read operation, and operates as the write driver in the program operation. The page buffer 300 receives a bias enable signal BEN from the control logic 500, and controls the read operation of the memory cell array 100.

In an embodiment, the page buffer 300 is configured to read or program 1-bit data. In another embodiment, the page buffer 300 is configured to read or program 2-bit data. However, embodiments are not limited thereto. The page buffer 300 may be configured to read or program 3 or more bit data. The page buffer 300 may include a plurality of unit page buffers. If a memory cell stores multi-bit data, a unit page buffer of the page buffer 300 may include two or more latches.

The column decoder 400 may select a predetermined number of unit page buffers of the page buffer 300. In other words, the column decoder 400 may select columns of the memory cell array 100 in a predetermined number of units in response to a column address. As a result, a predetermined number of unit page buffers are activated in response to the column address, and a predetermined number of columns of the memory cell array 110 coupled to the activated unit page buffers are selected.

The control logic 500 may provide overall control to the semiconductor device. The control logic 500 outputs the precharge signal BPCG and the wordline bias precharge signal WLPCG to the row decoder 200 in response to a command signal CMD and an address ADD, and also outputs the bias enable signal BEN to the page buffer 300 and the voltage generator 600.

The voltage generator 600 generates various drive voltages for performing program, erase, and read operations in response to the bias enable signal BEN from the control logic 500 and the control signal CON from the control signal generator 900. The drive voltages may include a program voltage, a pass voltage, an erase voltage, a read voltage, a program/erase verification voltage, a refresh verification voltage, etc. The voltage generator 600 may generate voltages having different levels in response to the bias enable signal BEN received from the control logic 500.

The microprocessor 800 receives a read command flag signal RCMDF and a block address BADD and generates a ready/busy signal RBb based on the read command flag signal RCMDF and the block address BADD. In an embodiment, the ready/busy signal RBb is an internal signal for activating a cell operation of the memory cell array 100, e.g., a read operation. In an embodiment, the ready/busy signal RBb is activated to a logic low level to initiate a read operation in the semiconductor device.

The ready/busy signal RBb may denote a cell operation state of the semiconductor device. Therefore, it is possible to determine whether or not the semiconductor device is in a state where data can be input or output to or from the semiconductor device based on the ready/busy signal RBb.

If the ready/busy signal RBb is in a ready state, this means that the semiconductor device is ready to receive a command signal CMD from an external part. If the ready/busy signal RBb is in a busy state, this means that the semiconductor device is performing internal operations and cannot receive the command signal CMD as an input. If the ready/busy signal RBb is enabled to a logic low level, i.e., the busy state, the semiconductor device can start the internal operations.

The control signal generator 900 receives the ready/busy signal RBb as an input, and performs signal processing using the received signal RBb. The control signal generator 900 outputs various control signals CON for controlling the semiconductor device to the row decoder 200, the page buffer 300, and the voltage generator 600 in response to the ready/busy signal RBb.

Figure 2:
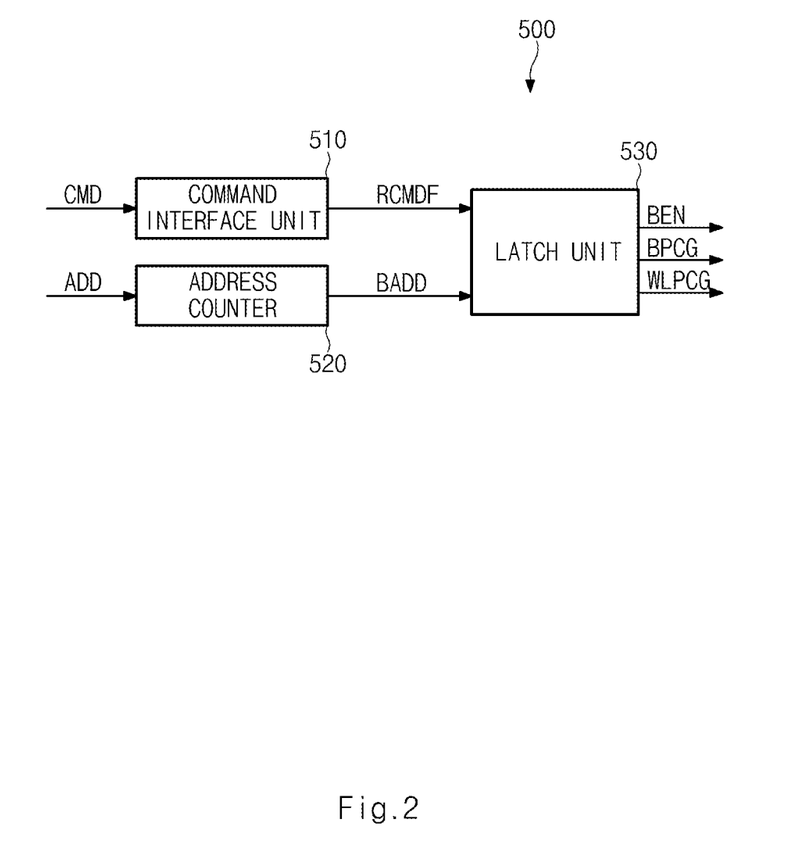
FIG. 2 is a circuit diagram illustrating a control logic shown in FIG. 1.

FIG. 2 is a circuit diagram illustrating the control logic 500 shown in FIG. 1 according to an embodiment.

Referring to FIG. 2, the control logic 500 includes a command interface unit 510, an address counter 520, and a latch unit 530.

The command interface unit 510 receives the command signal CMD from an external part, and outputs the read command flag signal RCMDF to the latch unit 530. In an embodiment, the read command flag signal RCMDF is a flag signal generated based on a read start command.

The command interface unit 510 may receive the command signal CMD by communicating with an external memory controller, a host system, or a computing system. The semiconductor device may pre-load access signals needed for performing the read operation upon receiving the command signal CMD through the command interface unit 510.

The address counter 520 receives the address ADD from the external part, counts the number of address reception times, and outputs the block address BADD to the latch unit 530.

The read command flag signal RCMDF and the block address BADD output from the command interface unit 510 and the address counter 520, respectively, are also input to the microprocessor 800 in FIG. 1.

The latch unit 530 latches the read command flag signal RCMDF and the block address BADD, and outputs the bias enable signal BEN to the page buffer 300 and the voltage generator 600. In an embodiment, the latch unit 530 is synchronized with an enable period of the read command flag signal RCDMF, so that the latch unit 530 enables the bias enable signal BEN in response to the read command flag signal RCDMF.

The latch unit 530 outputs the block bias precharge signal BPCG and the wordline bias precharge signal WLPCG to the row decoder 200. In an embodiment, the latch unit 530 is synchronized with an enable period of the block address BADD, so that the latch unit 530 enables the block bias precharge signal BPCG and the wordline bias precharge signal WLPCG in response to the block address BADD.

The latch unit 530 may include a flip-flop register or a D-latch. In an embodiment, the latch unit 530 includes a rising-edge flip-flop that is synchronized with a rising edge of an input signal so that the rising-edge flip-flop is activated in response to the rising edge of the input signal.

If the bias enable signal BEN, the block bias precharge signal BPCG, and the wordline bias precharge signal WLPCG are activated, the row decoder 200, the page buffer 300, and the voltage generator 600 start their operations. As described above, a semiconductor device according to an embodiment is configured to pre-load and activate bias signals such as the bias enable signal BEN, the block bias precharge signal BPCG, and the wordline bias precharge signal WLPCG, which are designed to consume a read operation time, before the ready/busy signal RBb is activated to a logic low level.

Figure 3:
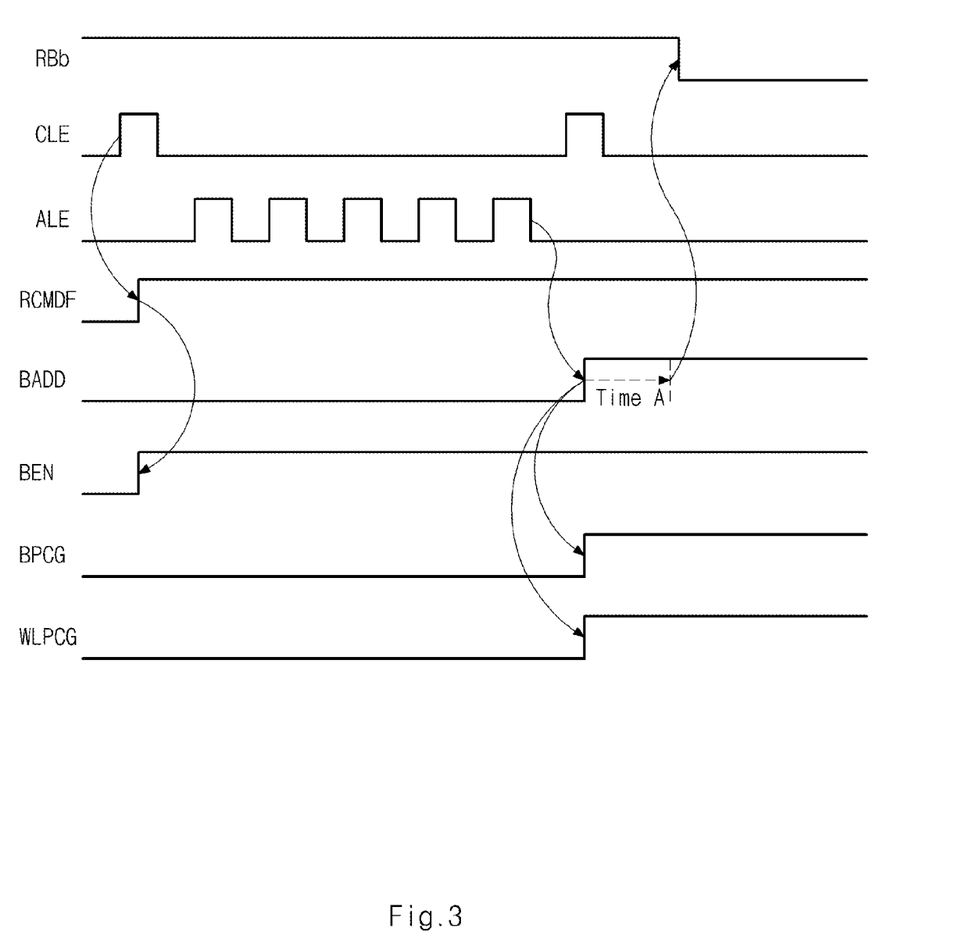
FIG. 3 is a timing diagram illustrating a method for operating a semiconductor device according to an embodiment.

FIG. 3 is a timing diagram illustrating a method for operating a semiconductor device according to an embodiment. The method will be described with reference to FIGS. 1 and 2.

Referring to FIG. 3, a command enable signal CLE is activated in response to the command signal CMD. In an embodiment, the command enable signal CLE is generated in the command interface unit 510 to have a pulse pattern corresponding to that of the command signal CMD, and is generated to adjust the timing of generating an internal command.

After that, the command interface unit 510 activates the read command flag signal RCMDF to a logic high level in response to the command enable signal CLE, and outputs the high-level read command flag signal RCMDF to the latch unit 530 and the microprocessor 800.

The latch unit 530 is synchronized with a rising edge of the read command flag signal RCMDF, activates the bias enable signal BEN for performing the read operation of the memory cell array 100, and outputs the activated bias enable signal BEN to the page buffer 300.

In this embodiment, the bias enable signal BEN is activated to a logic high level to be synchronized with the read command flag signal RCMDF. However, embodiments are not limited thereto. Thereafter, the address ADD is input to the semiconductor device, and thus an address enable signal ALE is generated in the address counter 520. In an embodiment, the address enable signal ALE is generated to adjust the timing of generating an internal address. If the address enable signal ALE is generated and a predetermined delay time elapses, the internal address, e.g., the block address BADD, is activated.

In other words, the address counter 520 loads the address ADD, activates the block address BADD to a logic high level, and outputs the high-level block address BADD to the latch unit 530 and the microprocessor 800. Here, the address counter 520 counts the address ADD, and outputs the block address BADD in a read confirm command period.

The latch unit 530 is synchronized with a rising edge of the block address BADD, activates the block bias precharge signal BPCG and the wordline bias precharge signal WLPCG, and outputs the activated signals BPCG and WLPCG to the row decoder 200.

In this embodiment, the block bias precharge signal BPCG and the wordline bias precharge signal WLPCG are activated to a logic high level in response to the rising edge of the block address BADD. However, embodiments are not limited thereto. That is, the block bias precharge signal BPCG and the wordline bias precharge signal WLPCG can be activated at any time in a period (Time A) after the block address BADD is activated to a logic high level and before the ready/busy signal RBb is activated to a logic low level. In an embodiment, the period (Time A) is determined based on a precharge operation time of the memory cell array 100 of the semiconductor device.

The time it takes to output data in response to a command signal and an address that are input from an external part is an important factor in determining the performance of a semiconductor device. In a read operation, the time that elapses before read data is transferred from a unit cell to a latch of the page buffer 300 after the command signal CMD is input is referred to as a read operation time tR.

Therefore, all internal operations corresponding to the read operation should be completed within the read operation time tR. Since the read operation time tR is used as a reference for estimating performance of the read operation of the semiconductor device, it is very important to reduce the read operation time tR to enhance the performance of the semiconductor device.

For this purpose, in accordance with an embodiment, bias signals such as the bias enable signal BEN, the block bias precharge signal BPCG, and the wordline bias precharge signal WLPCG, which are required for a cell operation, are pre-loaded and activated before the ready/busy signal RBb is activated since the read operation time tR depends on the ready/busy signal RBb. The memory cell array 100 performs a precharge operation for a memory block and a wordline corresponding to the address ADD in response to the bias enable signal BEN, the block bias precharge signal BPCG, and the wordline bias precharge signal WLPCG before the ready/busy signal RBb is activated. As a result, when the semiconductor device is initialized, the read operation time tR is reduced by delaying a point in time when the ready/busy signal RBb is activated after the precharge operation is performed.

Figure 4:
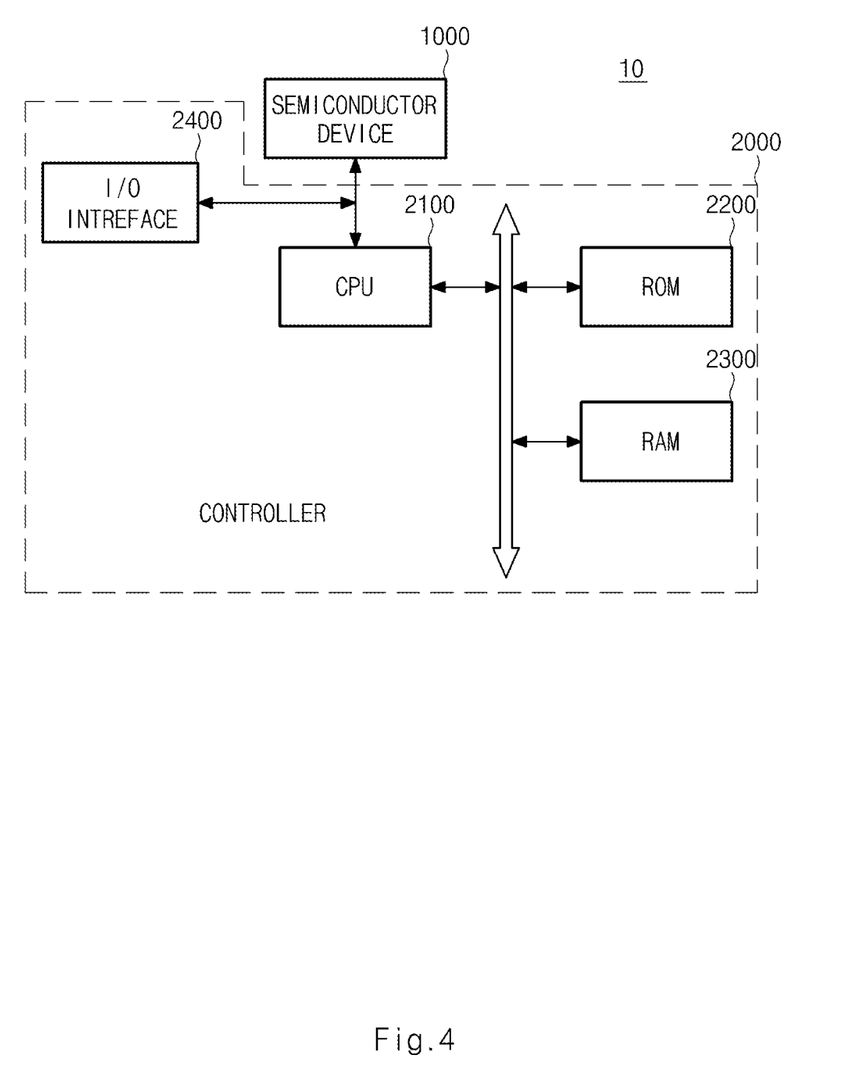
FIG. 4 is a block diagram illustrating a semiconductor system including a semiconductor device according to an embodiment.

FIG. 4 is a block diagram illustrating a semiconductor system 10 including a semiconductor device according to an embodiment.

Referring to FIG. 4, the semiconductor system 10, e.g., a smart card, includes a semiconductor device 1000 and a controller 2000. The semiconductor device 1000 may have a configuration that is substantially the same as that shown in FIG. 1. The controller 2000 controls the semiconductor device 1000, and includes a central processing unit (CPU)

2100, a read only memory (ROM) 2200, a random access memory (RAM) 2300, and an input/output (I/O) interface 2400.

The CPU 2100 may provide overall control to the semiconductor system 10 based on various programs stored in the ROM 2200, and the I/O interface 2400 may provide an interface with an external part.

A flash memory device is a non-volatile memory device capable of maintaining stored data when powered off. With the increasing number of users who use mobile devices such as cellular phones, PDA digital cameras, portable game consoles, MP3 players (MP3Ps), and so on, the flash memory device has been widely used not only for data storage but also for code storage. The flash memory device can also be applied to home applications, for example, HDTVs, DTVs, routers, global positioning systems (GPSs), etc.

Embodiments of the present disclosure are implemented by not only a method and an apparatus, but may be implemented using a program for realizing a function corresponding to the construction of the embodiments of the present disclosure or a recording medium on which such a program is recorded. Implementations can be easily achieved by those having ordinary skill in the art to which the present disclosure pertains from the above descriptions of various embodiments.

Figure 5:
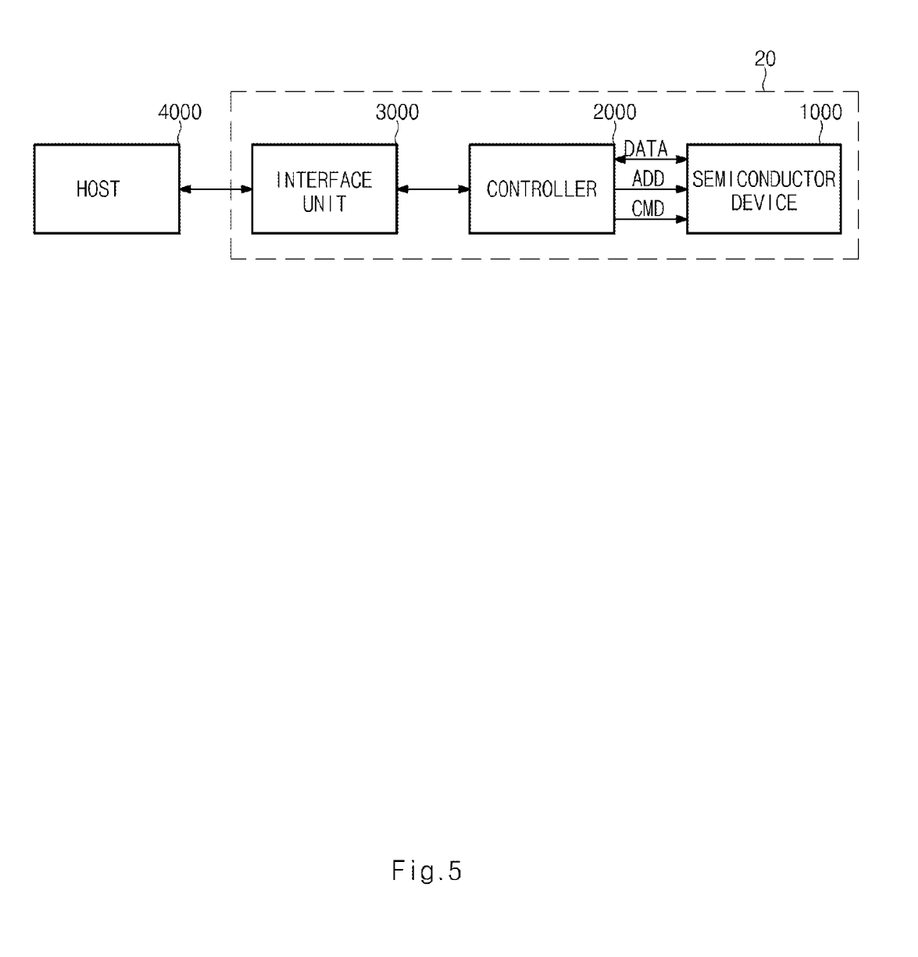
FIG. 5 is a block diagram illustrating a semiconductor system including a semiconductor device according to an embodiment.

FIG. 5 is a block diagram illustrating a semiconductor system 20 including a semiconductor device according to an embodiment.

Referring to FIG. 5, the semiconductor system 20 may include, a multimedia card (MMC), a secure digital (SD) card, a multiuse card, a micro SD card, a memory stick, a compact SD card, an ID card, a personal computer memory card international association (PCMCIA) card, a solid state disc (SSD) card, a chip card, a smart card, a universal serial bus (USB), etc.

The semiconductor system 20 includes a semiconductor device 1000, a controller 2000 for controlling the semiconductor device 1000, and an interface unit 3000 for interfacing with an external host 4000.

The interface unit 3000 may exchange a variety of information with the external host 4000, and may be configured to use different protocols. The controller 2000 may control a write operation, a read operation, and all states of the semiconductor device 1000 in response to a control signal and a command signal received from the host 4000 through the interface unit 3000.

In more detail, the controller 2000 may provide data DATA, an address ADD, and a command signal CMD to the semiconductor device 1000. The semiconductor device 1000 may have a configuration that is substantially the same as that of the semiconductor device shown in FIG. 1. The controller 2000 may generate the command signal CMD for controlling the semiconductor device 1000.

As is apparent from the above description, a semiconductor device and a method for operating the same according to an embodiment can reduce a read operation time denoted by "tR" by activating bias signals for performing a precharge operation before the ready/busy signal RBb is activated. As a result, read performance of the semiconductor device is improved.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description. All changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
    a page buffer suitable for reading data out of a memory cell array in response to a bias enable signal; and
    a control logic suitable for generating the bias enable signal and a bias precharge signal that are used to control a read operation of the memory cell array,
    wherein the control logic generates a read command flag signal upon receiving a command signal, activates the bias enable signal in response to the read command flag signal, and activates the bias precharge signal in response to a block address before a ready/busy signal activating the read operation of the memory cell array is enabled.

2. The semiconductor device according to claim 1, wherein the bias precharge signal comprises a block bias precharge signal for precharging a memory block of the memory cell array.

3. The semiconductor device according to claim 1, wherein the bias precharge signal comprises a wordline bias precharge signal for precharging a word line of the memory cell array.

4. The semiconductor device according to claim 1, further comprising:
    a voltage generator suitable for generating a drive voltage for controlling the memory cell array when the bias enable signal is activated; and
    a row decoder suitable for controlling a precharge operation of the memory cell array when the bias precharge signal is activated.

5. The semiconductor device according to claim 1, wherein the control logic comprises:
    a command interface suitable for generating the read command flag signal upon receiving the command signal;
    an address counter suitable for outputting the block address by counting an address; and
    a latch suitable for outputting the bias enable signal and the bias precharge signal in response to the read command flag signal and the block address.

6. The semiconductor device according to claim 5, wherein the bias enable signal is enabled to be synchronized with the read command flag signal.

7. The semiconductor device according to claim 5, wherein the bias precharge signal is enabled to be synchronized with the block address.

8. The semiconductor device according to claim 5, wherein the latch comprises a flip-flop.

9. The semiconductor device according to claim 5, wherein the ready/busy signal is activated in response to the block address.

10. The semiconductor device according to claim 5, wherein the ready/busy signal is enabled within a predetermined time after the block address is enabled, the predetermined time being determined based on a precharge operation time of the memory cell array.

11. A method for operating a semiconductor device, the method comprising:
  generating a read command flag signal upon receiving a command signal;
  activating a bias enable signal in response to the read command flag signal to perform a read operation of a memory cell array;
  activating a bias precharge signal in response to a block address before a ready/busy signal activating the read operation of the memory cell array is enabled to precharge the memory cell array; and
  reading data out of the memory cell array in response the ready/busy signal, and storing the read-out data in a page buffer,
  wherein the bias enable signal and the bias precharge signal are enabled before the ready/busy signal is enabled.

12. The method according to claim 11, wherein the bias precharge signal comprises a block bias precharge signal for precharging a memory block of the memory cell array.

13. The method according to claim 11, wherein the bias precharge signal comprises a wordline bias precharge signal for precharging a word line of the memory cell array.

14. The method according to claim 11, wherein the bias enable signal is enabled to be synchronized with a rising edge of the read command flag signal.

15. The method according to claim 11, wherein activating the bias precharge signal comprises:
  generating a block address by counting an address; and
  activating the bias precharge signal in response to the block address.

16. The method according to claim 15, wherein the bias precharge signal is enabled to be synchronized with a rising edge of the block address.

17. The method according to claim 11, wherein the ready/busy signal is enabled in response to the block address.

18. A semiconductor system comprising:
  a semiconductor device; and
  a controller suitable for controlling the semiconductor device in response to a request of a host,
  wherein the semiconductor device comprises:
    a page buffer suitable for reading data out of a memory cell array in response to a bias enable signal; and
    a control logic suitable for generating the bias enable signal and a bias precharge signal that are used to control a read operation of the memory cell array,
    wherein the control logic generates a read command flag signal upon receiving a command signal, activates the bias enable signal in response to the read command flag signal, and activates the bias precharge signal in response to a block address before a ready/busy signal activating the read operation of the memory cell array is enabled.

19. The semiconductor system according to claim 18, wherein the control logic comprises:
  a command interface suitable for generating the read command flag signal upon receiving the command signal;
  an address counter suitable for outputting the block address by counting an address; and
  a latch suitable for outputting the bias enable signal and the bias precharge signal in response to the read command flag signal and the block address.

* * * * *